(12) United States Patent
Sankman

(10) Patent No.: US 9,918,414 B2
(45) Date of Patent: Mar. 13, 2018

(54) ELECTROMAGNETIC INTERFERENCE SHIELDS FOR ELECTRONIC PACKAGES AND RELATED METHODS

(71) Applicant: INTEL CORPORATION, Santa Clara, CA (US)

(72) Inventor: Robert Sankman, Phoenix, AZ (US)

(73) Assignee: INTEL CORPORATION, Santa Clara, CA (US)

(*) Notice: Subject to any disclaimer, the term of this patent is extended or adjusted under 35 U.S.C. 154(b) by 0 days.

(21) Appl. No.: 14/974,222

(22) Filed: Dec. 18, 2015

(65) Prior Publication Data

US 2017/0181334 A1   Jun. 22, 2017

(51) Int. Cl.
*H05K 9/00* (2006.01)
*H01L 23/552* (2006.01)

(52) U.S. Cl.
CPC .......... *H05K 9/0007* (2013.01); *H01L 23/552* (2013.01); *H05K 9/0086* (2013.01)

(58) Field of Classification Search
CPC ............................. H05K 9/0084; H01L 23/552
See application file for complete search history.

(56) References Cited

U.S. PATENT DOCUMENTS

| | | | | |
|---|---|---|---|---|
| 7,745,910 B1* | 6/2010 | Olson | ................... | H01L 21/561 257/659 |
| 8,093,690 B2* | 1/2012 | Ko | ....................... | H01L 21/561 257/660 |
| 2010/0072582 A1* | 3/2010 | Chandra | ............... | H01L 21/561 257/659 |
| 2011/0292621 A1 | 12/2011 | Beaumier et al. | | |
| 2012/0241922 A1* | 9/2012 | Pagaila | ............... | H01L 21/4832 257/659 |
| 2016/0099218 A1* | 4/2016 | Lee | ......................... | H01L 24/97 438/113 |

FOREIGN PATENT DOCUMENTS

| | | |
|---|---|---|
| JP | 2004259904 A | 9/2004 |
| KR | 1020110020548 A | 3/2011 |
| KR | 1020120044027 A | 5/2012 |
| KR | 1020150047167 A | 5/2015 |

OTHER PUBLICATIONS

PCT/US2016/059183, International Search Report and Written Opinion, Feb. 7, 2017, 18 pages.

* cited by examiner

*Primary Examiner* — Hung V Ngo
(74) *Attorney, Agent, or Firm* — Stoel Rives LLP

(57) ABSTRACT

Disclosed are EMI shielded packages, electronic device packages, and related methods. EMI shielded packages are formed by applying an insulating material to a first side of a substrate strip, separating the substrate strip into segments, adhering the insulating material of the segments to a solid conductor, applying a conductive paste around lateral sides of the segments, curing the conductive paste, and cutting through the conductive paste and the solid conductor to form the EMI packages. An electronic device package includes a substrate including electronic circuitry, an EMI shield, and an insulating material insulating the substrate from the EMI shield. The EMI shield includes a solid conductor adhered to the insulating material, and a cured conductive paste at least partially surrounding a lateral edge of the substrate. The cured conductive paste electrically connects the solid conductor to a conductive terminal in a lateral side of the substrate.

20 Claims, 11 Drawing Sheets

US 9,918,414 B2

ELECTROMAGNETIC INTERFERENCE SHIELDS FOR ELECTRONIC PACKAGES AND RELATED METHODS

TECHNICAL FIELD

The disclosure may relate generally to the field of electromagnetic interference (EMI) shields for electronic devices, and more specifically to methods of forming EMI shields for electronic device packages.

BACKGROUND

Electromagnetic interference (EMI) shielding of an electronic package used in electrical circuits including radio frequency (RF) components, digital components, or combinations thereof may improve functioning of the electrical circuits. For example, RF components may be sensitive to fields induced by other components, and/or induce interfering fields on other components. Also, digital components may induce fields when switching between extremes in voltage potential, which may also induce fields on other components in the electrical circuits. EMI shielding may reduce the effects of such fields by electrically isolating sensitive and/or radiative components from other components.

BRIEF DESCRIPTION OF THE DRAWINGS

FIG. 1A is a simplified plan view of a top side of the electronic device package.

FIG. 1B is a simplified cross-sectional view of the electronic device package taken along line 1B of FIG. 1A.

FIG. 1C is a simplified plan view of a bottom side of the package.

FIG. 3A is a simplified plan view of a first side of the substrate strip.

FIG. 3B is a simplified lateral side view of the substrate strip.

FIG. 3C is a simplified plan view of a second side of the substrate strip.

FIG. 4A is a simplified plan view of the first side of the substrate strip.

FIG. 4B is a simplified lateral side view of the substrate strip.

FIG. 4C is a simplified plan view of a second side of the substrate strip.

FIG. 5A is a simplified plan view of a first side of the segments.

FIG. 5B is a simplified side view of the segments.

FIG. 5C is a simplified plan view of a second side of the segments.

FIG. 6A illustrates a simplified plan view of the segments adhered to the solid conductor.

FIG. 6B illustrates a simplified side view of the segments adhered to the solid conductor.

FIG. 7A is a simplified plan view illustrating the conductive paste applied around the segments.

FIG. 7B is a simplified cross-sectional view illustrating the conductive paste applied around the segments taken along line 7B of FIG. 7A.

FIG. 8A is a simplified plan view of the segments.

FIG. 8B is a simplified side view of the segments.

FIG. 9A is a simplified plan view of the packages.

FIG. 9B is a simplified side view of the packages.

FIG. 11A is a simplified view of a second side of the substrate strip.

FIG. 11B is a simplified side view of the substrate strip adhered to the solid conductor.

DETAILED DESCRIPTION OF PREFERRED EMBODIMENTS

Figure 1A:
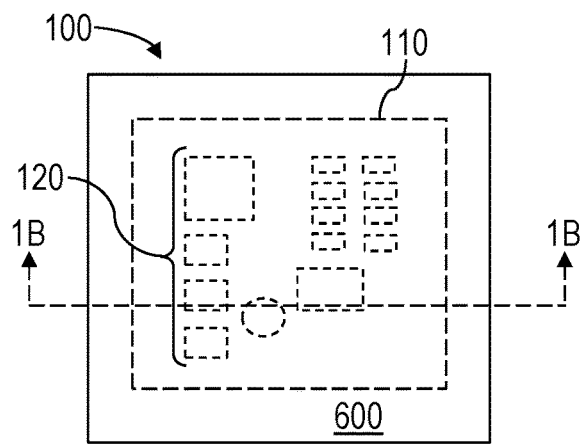
FIGS. 1A-1C are simplified views of an electronic device package.

In the following detailed description, reference is made to the accompanying drawings, which form a part hereof, and in which is shown by way of illustration specific embodiments in which the present disclosure may be practiced. These embodiments are described in sufficient detail to enable those of ordinary skill in the art to practice the disclosure made herein. It should be understood, however, that the detailed description and the specific examples, while indicating examples of embodiments of the disclosure, are given by way of illustration only, and not by way of limitation. From the disclosure, various substitutions, modifications, additions, rearrangements, or combinations thereof within the scope of the disclosure may be made and will become apparent to those of ordinary skill in the art.

In accordance with common practice, the various features illustrated in the drawings may not be drawn to scale. The illustrations presented herein are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus or all operations of a particular method.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal for clarity of presentation and description. It should be understood by a person of ordinary skill in the art that the signal may represent a bus of signals, wherein the bus may have a variety of bit widths and the present disclosure may be implemented on any number of data signals including a single data signal.

The various illustrative logical blocks, modules, circuits, and algorithm acts described in connection with embodiments disclosed herein may be implemented as electronic hardware, computer software, or combinations of both. To clearly illustrate this interchangeability of hardware and software, various illustrative components, blocks, modules, circuits, and acts are described generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the embodiments of the disclosure described herein.

In addition, it is noted that the embodiments may be described in terms of a process that is depicted as a flowchart, a flow diagram, a structure diagram, a signaling diagram, or a block diagram. Although a flowchart or signaling diagram may describe operational acts as a sequential process, many of these acts can be performed in another sequence, in parallel, or substantially concurrently. In addition, the order of the acts may be re-arranged. A process may correspond to a method, a function, a procedure, a subroutine, a subprogram, etc. Furthermore, the methods disclosed herein may be implemented in hardware, software, or both. If implemented in software, the functions may be stored or transmitted as one or more computer-readable instructions (e.g., software code) on a computer-readable medium. Computer-readable media includes both computer storage media (i.e., non-transitory media) and communication media including any medium that facilitates transfer of a computer program from one place to another.

As used herein, the term "conductive paste" refers to conductive pastes, conductive inks, other conductive fluids, or combinations thereof that can be dispensed through a nozzle or a syringe, or may be spread across a surface with a resilient blade tool (e.g., a "squeegee"), in contrast to conductors that are sputtered or grown onto a surface.

Disclosed herein are EMI shielded packages, electronic device packages, and related methods. EMI shields may be formed on electronic device packages using simple, inexpensive, and size economic methods.

In some embodiments, disclosed herein is a plurality of EMI shielded packages, formed by applying an insulating material to a first side of a substrate strip including electronic circuitry on or in the first side of the substrate strip, separating the substrate strip into a plurality of segments, adhering the insulating material of the segments to a solid conductor, applying a conductive paste around lateral sides of the segments, curing the conductive paste, and cutting through the conductive paste and the solid conductor to form the plurality of EMI shielded packages.

In some embodiments, disclosed herein is an electronic device package including a substrate, an insulating material, and an electromagnetic interference (EMI) shield. The substrate includes electronic circuitry in or on at least a first side of the substrate, and at least one conductive terminal at a lateral edge of the substrate. The insulating material is formed over the first side of the substrate and the electronic circuitry. The EMI shield includes a solid conductor adhered to the insulating material opposite the first side of the substrate. The insulating material electrically insulates the electronic circuitry from the solid conductor. The EMI shield also includes a cured conductive paste at least partially surrounding the lateral edge of the substrate and electrically connecting the conductive terminal to the solid conductor.

In some embodiments, disclosed herein is a method of forming an electromagnetic interference (EMI) shield. The method includes applying an insulating material to a first side of a substrate strip including electrical components formed at least one of on and in the first side of the substrate strip, and adhering a solid conductor to the insulating material opposite the first side of the substrate strip. The insulating material electrically insulates the first side of the substrate strip from the solid conductor. The method also includes separating the substrate strip and the applied insulating material into a plurality of segments, and applying a conductive paste between at least partially around lateral sides of the plurality of segments. The conductive paste electrically connects the solid conductor to a conductive terminal exposed on at least one lateral side of each of the plurality of segments. The method further includes cutting through the conductive paste and the solid conductor to form a plurality of EMI shielded packages.

As used herein, the terms "insulate," "insulating," "insulator," and other forms of the word "insulate" refer specifically to electrically insulating. Also, as used herein, the terms "conduct," "conducting," "conductor," and other forms of the word "conduct" refer specifically to electrically conducting.

Figure 1B:
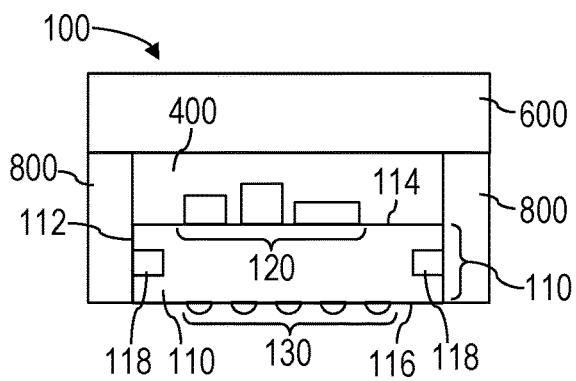
Figure 1C:
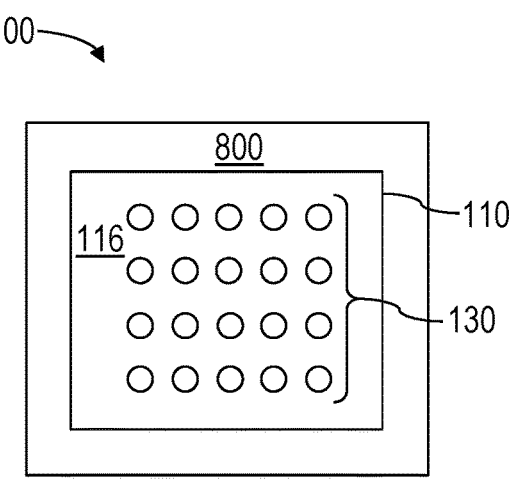

FIGS. 1A-1C are simplified views of an electronic device package 100 (sometimes referred to herein as "package" 100). FIG. 1A is a simplified plan view of a top side of the package 100. FIG. 1B is a simplified cross-sectional view of the package 100 taken along line 1B of FIG. 1A. FIG. 1C is a simplified plan view of a bottom side of the package 100. Referring to FIGS. 1A-1C together, the package 100 includes a substrate 110 (e.g., a semiconductor substrate, a printed circuit board (PCB), etc.) including electronic circuitry 120 in or on at least a first side 114 of the substrate 110. The substrate 110 may also include at least one conductive terminal 118 at a lateral edge 112 of the substrate 110. In some embodiments, the conductive terminal 118 may extend completely around the lateral edge of the substrate. In some embodiments, the conductive terminal 118 may extend only partly around the lateral edge of the substrate. The substrate 110 may also include one or more conductive pads 130 (e.g., pads, pins, solder balls, etc.) on or in a second side 116 of the substrate 110.

The package 100 may also include an insulating material 400 on the first side 114 of the substrate 110 and the electronic circuitry 120. By way of non-limiting example, the insulating material 400 may include an over mold (e.g., plastic, rubber, etc.), an insulating epoxy, an oxide material (e.g., silicon dioxide), other insulating materials, and combinations thereof.

The package 100 further includes an electromagnetic interference (EMI) shield 600, 800 shielding the first side 114 and the lateral edge 112 of the substrate 110. The EMI shield 600, 800 includes a solid conductor 600 adhered to the insulating material 400 opposite the first side 114 of the substrate 110. The insulating material 400 may electrically insulate the electronic circuitry 120 from the solid conductor 600. In some embodiments, the solid conductor 600 may include a conductive foil (e.g., a metal foil). By way of non-limiting example, the conductive foil may include a copper foil, an aluminum foil, a silver foil, a gold foil, other foil, or combinations thereof.

The EMI shield 600, 800 also includes a cured conductive paste 800 at least partially surrounding the lateral edge 112 of the substrate 110. In some embodiments, the cured conductive paste 800 may completely surround the lateral edge 112 of the substrate 110. The cured conductive paste 800 may electrically connect the conductive terminal 118 to the solid conductor 600. In some embodiments, the cured conductive paste 800 may include a cured epoxy including conductive particles that have been cured to form the cured conductive paste 800. By way of non-limiting example, the conductive particles may include at least one of a solder and a metal (e.g., copper, silver, gold, etc.).

The conductive terminal 118 may be electrically connected to a power supply through the substrate 110. In some embodiments, the conductive terminal 118 may be electrically connected to ground (0 Volts). Accordingly, the solid conductor 600 and the cured conductive paste 800 may also be electrically connected to ground (e.g., through the conductive terminal 118). In such embodiments, the solid conductor 600 and the cured conductive paste 800 may serve as a Faraday cage that shields the package 100 from EMI.

Figure 2:
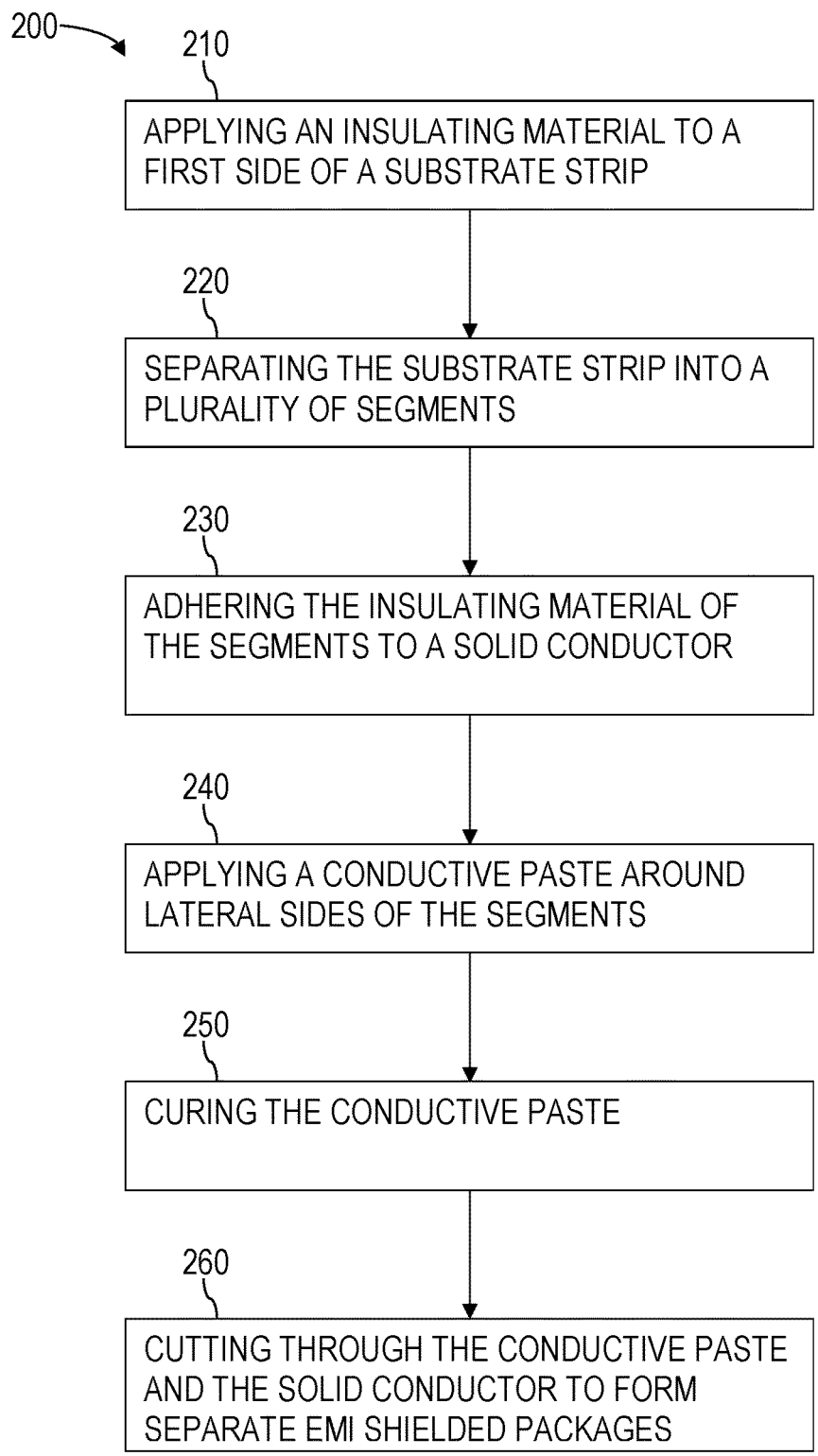
FIG. 2 is a simplified flowchart illustrating a method of forming an electromagnetic interference shield of the electronic device package of FIGS. 1A-1C.
Figure 3A:
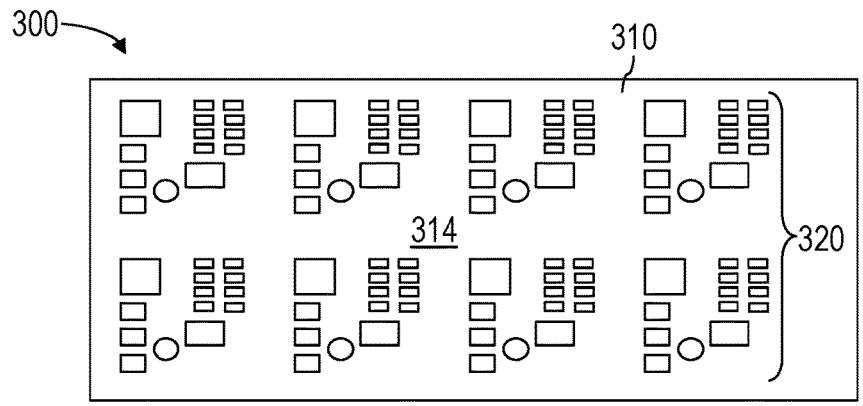
FIGS. 3A-3C are simplified views of an example substrate strip used in the method of FIG. 2.
Figure 3B:
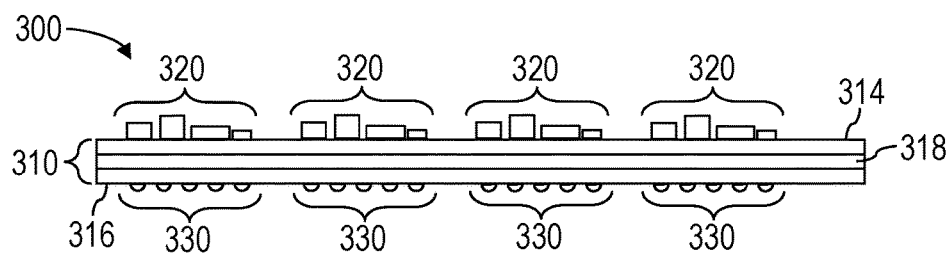
Figure 3C:
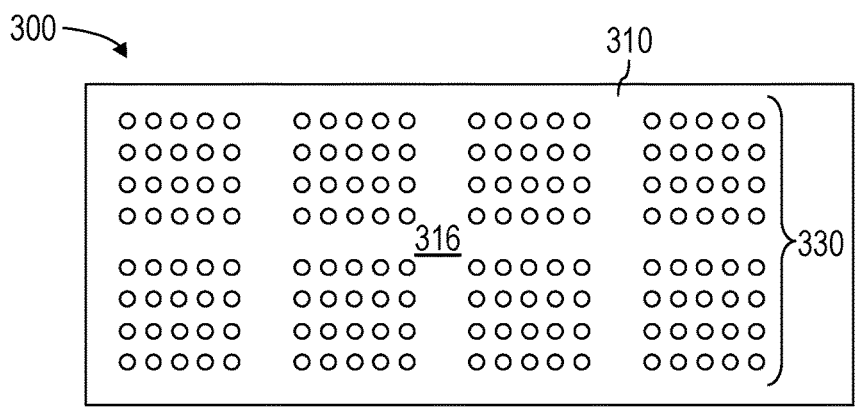

FIG. 2 is a simplified flowchart illustrating a method 200 of forming the EMI shield 600, 800 of the package 100 of FIGS. 1A-1C. FIGS. 3A-9B are discussed below to illustrate acts 210-260 of the method 200. FIGS. 3A-3C are simplified views of an example substrate strip 300 (sometimes referred to herein simply as "strip" 300). The strip 300 includes a substrate 310 including a first side 314 and a second side 316. FIG. 3A is a simplified plan view of a first side 314 of the strip 300. FIG. 3B is a simplified lateral side view of the strip 300. FIG. 3C is a simplified plan view of a second side 316 of the strip 300. The strip 300 may include electrical components 320, similar to the electrical components 120 discussed above with reference to FIGS. 1A and 1B, formed at least one of on and in the first side 314 of the substrate 310. The strip 300 may also include conductive pads 330, similar to the conductive pads 130 discussed above with reference to FIGS. 1B and 1C. The strip 300 may further include conductive terminal material 318, similar to the conductive terminal 118 discussed above with reference to FIG. 1B.

Figure 4A:
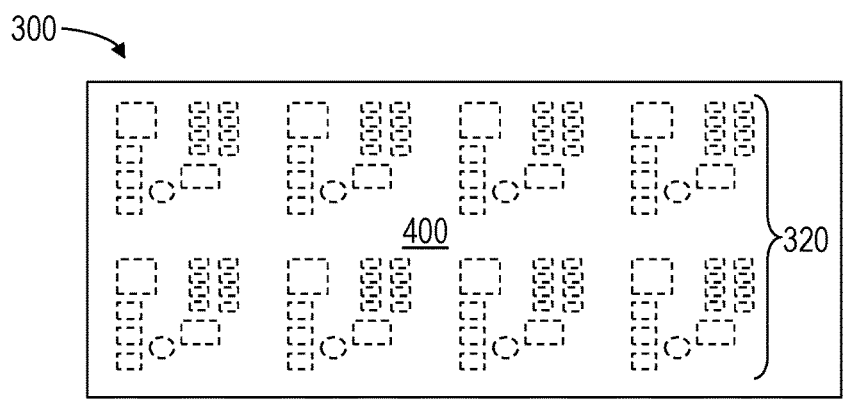
FIGS. 4A-4C are simplified views of the substrate strip of FIGS. 3A-3C after insulating material is applied thereto.
Figure 4B:
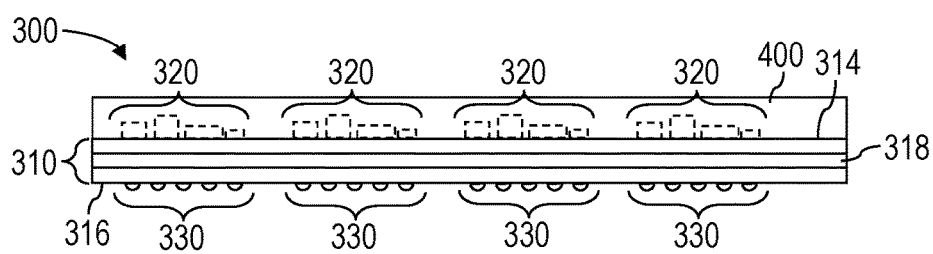
Figure 4C:
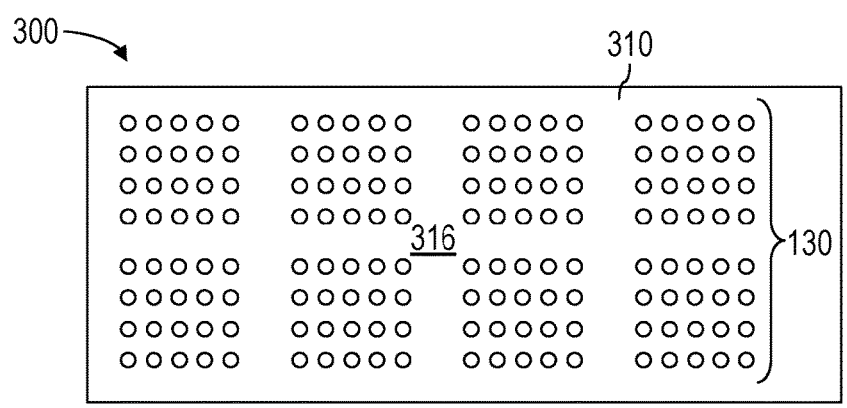

Referring to FIGS. 2-3C together, the method 200 may include applying 210 an insulating material 400 (FIGS. 4A and 4B) to the first side 314 of the strip 300. FIGS. 4A through 4C are simplified views of the strip 300 of FIGS. 3A-3C after the insulating material 400 is applied 210 thereto. FIG. 4A is a simplified plan view of the first side 314 of the strip 300, after the insulating material 400 is applied 210 thereto. FIG. 4B is a simplified lateral side view of the strip 300, after the insulating material 400 is applied 210 thereto. FIG. 4C is a simplified plan view of a second side 316 of the strip 300, after the insulating material 400 is applied thereto.

Referring now to FIGS. 2 and 4A-4C together, In some embodiments, applying 210 an insulating material 400 may include applying an over mold to the first side 314 of the substrate strip 300. In some embodiments, applying 210 an insulating material 400 to a first side 314 of a substrate strip 300 may include applying an electrically insulating epoxy to the first side 314 of the substrate strip 300. In some embodiments, applying 210 an insulating material 400 to a first side 314 of a substrate strip 300 may include applying an oxide material to the first side 314 of the substrate strip 300.

In some embodiments, the entire first side 314 and the circuitry 320 may be completely covered by the insulating material 400, as illustrated in FIGS. 4A and 4B. In some embodiments, only a portion of the first side 314 and the circuitry 320 may be covered by the insulating material 400.

Figure 5A:
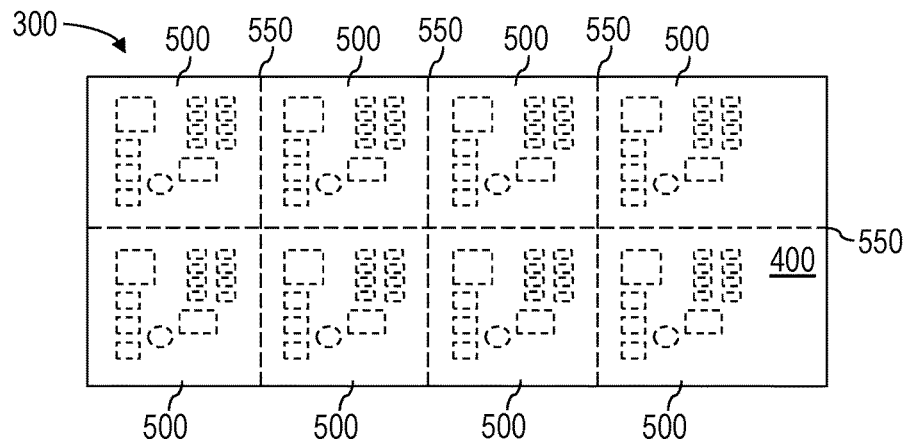
FIGS. 5A-5C are simplified views of cuts in the substrate strip of FIGS. 4A-4C resulting in segments of the strip.
Figure 5B:
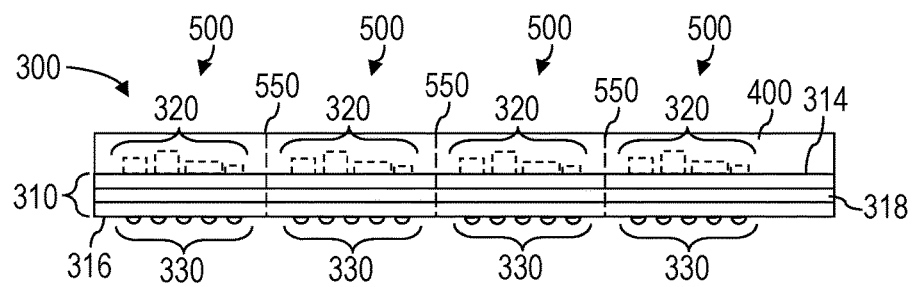
Figure 5C:
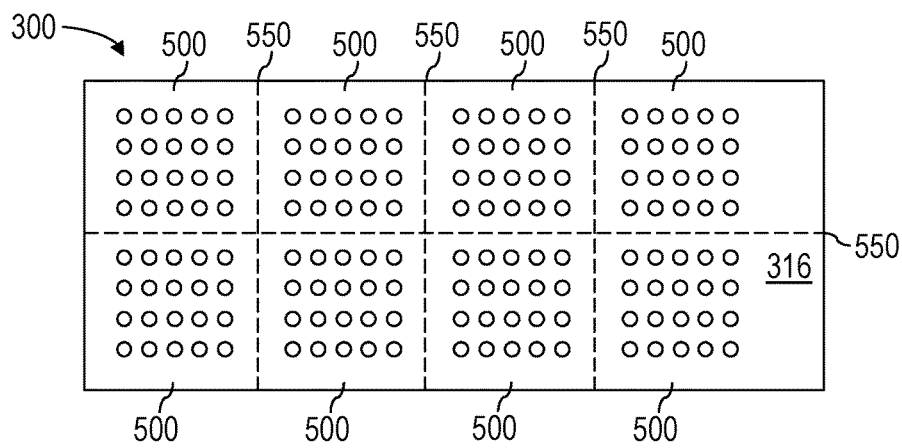

The method 200 may also include separating 220 the strip 300 into a plurality of segments 500 (FIGS. 5A-5C). In some embodiments, separating 220 the strip 300 into a plurality of segments 500 may include cutting (e.g., with a saw) through the substrate strip 300 and the insulating material 400 to separate the strip 300 into a plurality of electronic device packages. FIGS. 5A-5C are simplified views of cuts 550 in the strip 300 of FIGS. 4A-4C, which may result in segments 500 of the strip 300. FIG. 5A is a simplified plan view of the first side 314 (FIGS. 4A-4C) of the segments 500. FIG. 5B is a simplified side view of the segments 500. FIG. 5C is a simplified plan view of the second side 316 (FIGS. 4A-4C) of the segments 500.

In some embodiments, other methods of separating the strip 300 may be used. By way of non-limiting example, portions of the substrate strip 300 and insulating material 400 may be removed (e.g., using lithography, acids, other methods, and combinations thereof).

In the example of FIGS. 5A-5C, eight segments 500 are shown (two rows of four segments 500). It should be noted that the present disclosure also contemplates any other number of segments 500, including one segment 500. By way of non-limiting example, the strip 300 may be separated into three rows of ten segments, resulting in thirty segments.

Figure 6A:
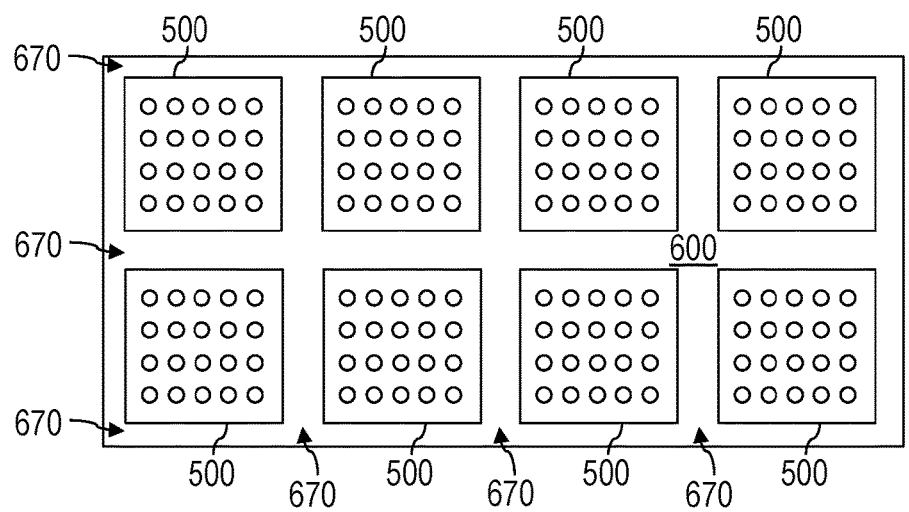
FIGS. 6A and 6B are simplified views of the segments of FIGS. 5A-5C adhered to a solid conductor.
Figure 6B:
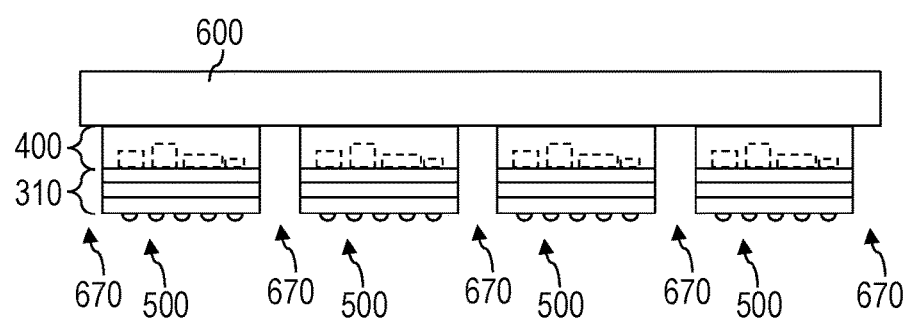

Returning to FIG. 2, the method 200 may further include adhering 230 the insulating material of the segments 500 to a solid conductor 600. FIGS. 6A and 6B are simplified views of the segments 500 adhered to the solid conductor 600. FIG. 6A illustrates a simplified plan view of the segments 500 adhered to the solid conductor 600. FIG. 6B illustrates a simplified side view of the segments 500 adhered to the solid conductor 600. Referring to FIGS. 2, 6A, and 6B together, the segments 500 may be spaced apart from each other such that space 670 at least partially surrounds each of the segments 500. In the example illustrated in FIGS. 6A and 6B, the space 670 completely laterally surrounds each of the segments 500. The insulating material 400 may insulate the substrate 310 and electrical circuitry 320 (FIGS. 3A and 3B) of each segment 500 from the solid conductor 600.

As previously discussed, in some embodiments the solid conductor 600 may include a conductive foil (e.g., a copper foil, an aluminum foil, a silver foil, a gold foil, other foil, or combinations thereof). In some embodiments, adhering 230 the insulating material 400 of the segments 500 to a solid conductor 600 may include adhering the insulating material 400 to the solid conductor 600 with an adhesive (e.g., an epoxy, a glue, etc.).

Figure 7A:
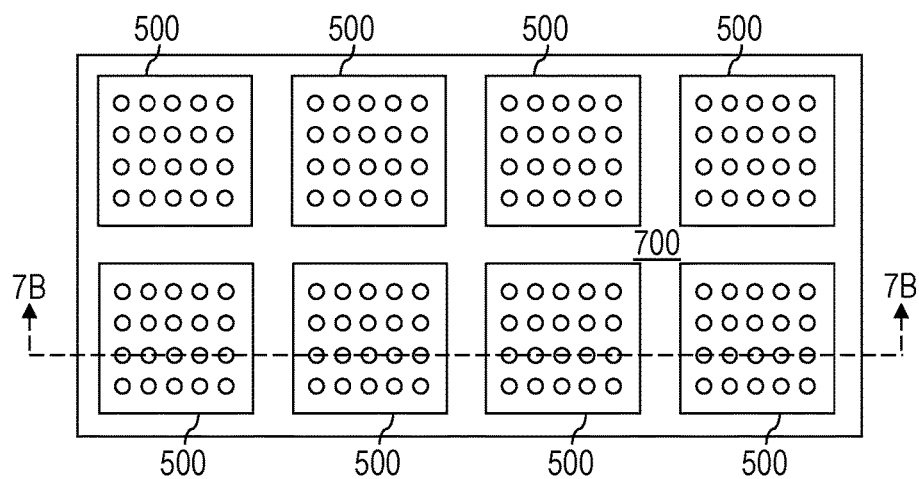
FIGS. 7A and 7B are simplified views of a conductive paste applied around the segments of FIGS. 6A and 6B.
Figure 7B:
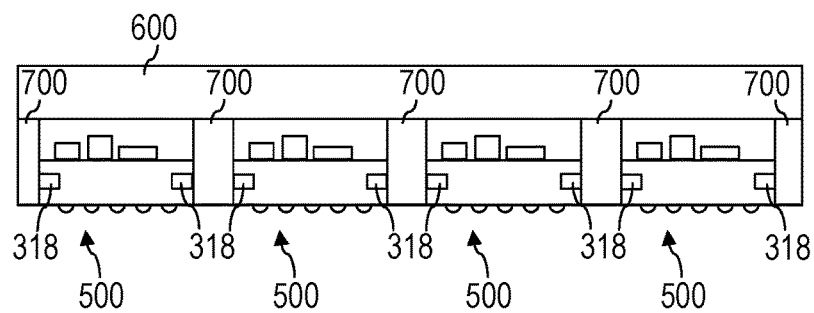

The method 200 may also include applying 240 a conductive paste 700 (FIGS. 7A and 7B) around lateral sides of the segments 500 (i.e., in the space 670). FIGS. 7A and 7B are simplified views of the conductive paste 700 applied around the segments 500. FIG. 7A is a simplified plan view illustrating the conductive paste 700 applied around the segments 500. FIG. 7B is a simplified cross-sectional view illustrating the conductive paste 700 applied around the segments taken along line 7B of FIG. 7A.

Referring to FIGS. 2, 7A, and 7B together, the conductive paste 700 may electrically connect conductive terminals 318 at the lateral sides of the segments 500 to the solid conductor 600. In some embodiments, the conductive terminals 318 may extend completely around the lateral sides of the segments 500. In some embodiments, the conductive terminals 318 may extend less than completely around the lateral sides of the segments 500.

In some embodiments the conductive paste 700 may completely surround each of the segments 500, as illustrated in FIGS. 7A and 7B. In some embodiments, the conductive paste 700 may only partially surround the segments 500.

In some embodiments, applying 240 a conductive paste 700 around lateral sides of the segments 500 may include applying the conductive paste 700 with a resilient blade tool (e.g., similar to a "squeegee"). In some embodiments, applying 240 a conductive paste 700 around lateral sides of the segments 500 may include applying the conductive paste 700 with an injection tool (e.g., similar to a syringe). In some embodiments, applying 240 a conductive paste 700 around lateral sides of the segments 500 may include flowing a heated conductive paste around the lateral sides of the segments 500.

Figure 8A:
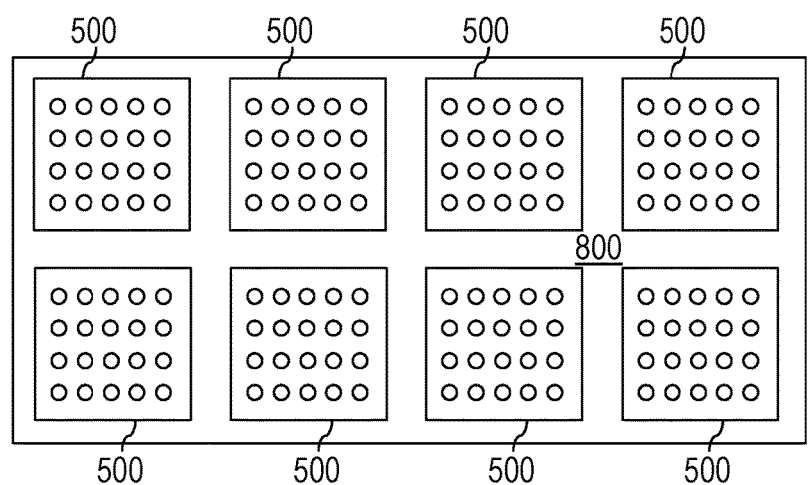
FIGS. 8A and 8B are simplified views of the segments of FIGS. 7A-7B and cured conductive paste.
Figure 8B:
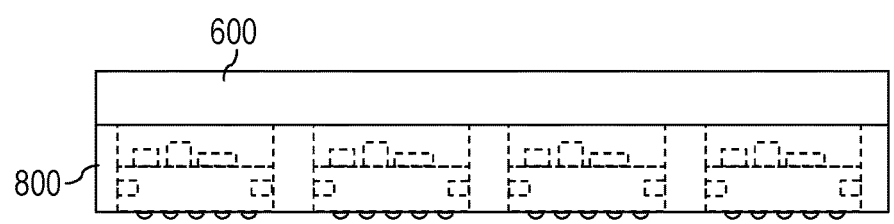

The method 200 may further include curing 250 the conductive paste 700. FIGS. 8A and 8B are simplified views of the segments 500 and the cured conductive paste 800. FIG. 8A is a simplified plan view of the segments 500 and the cured conductive paste 800. FIG. 8B is a simplified side view of the segments 500 in the cured conductive paste 800.

Referring to FIGS. 2, 8A, and 8B together, curing 250 the conductive paste 700 (FIGS. 7A and 7B) may transform the conductive paste 700 into a solid cured conductive paste 800. For example, curing the conductive paste 700 may include heating the conductive paste 700. By way of non-limiting example, if the conductive paste 700 includes an epoxy including conductive particles suspended therein, the epoxy may solidify when cured 250. Also, the conductive particles may melt and form conductive structures that extend through the epoxy. Accordingly, in some embodiments, the solid cured conductive paste 800 may conductive formations suspended in a cured epoxy.

Figure 9A:
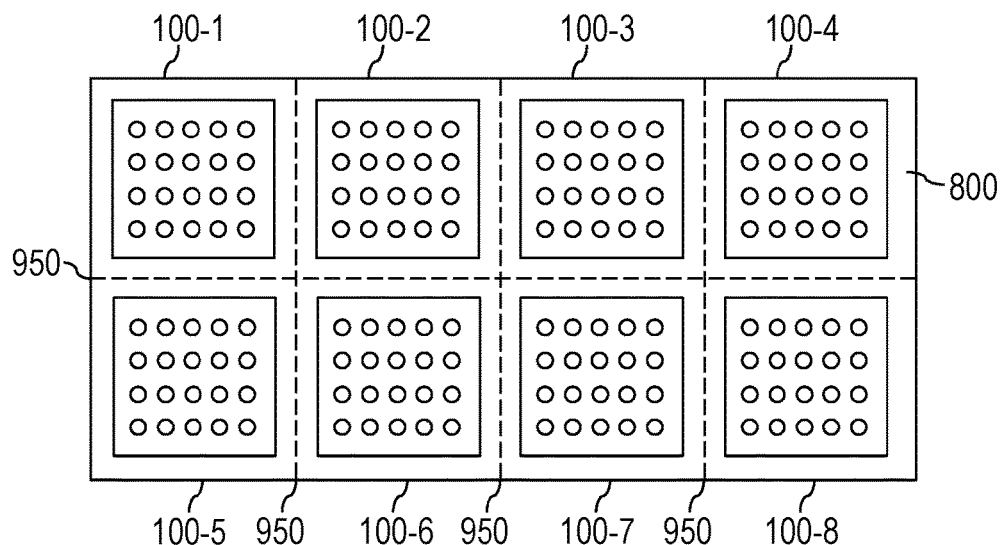
FIGS. 9A and 9B are simplified views of individual packages resulting from the method of FIG. 2.
Figure 9B:
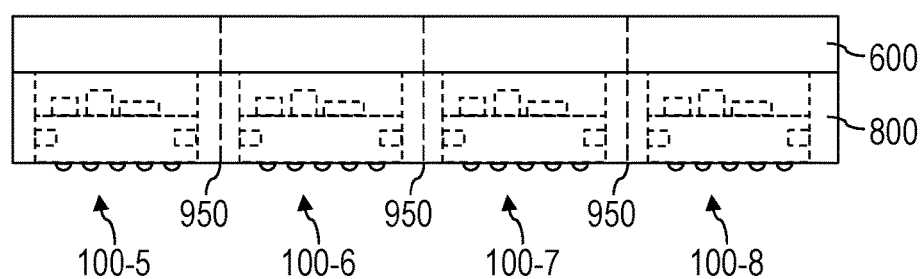

The method may also include cutting 260 through the cured conductive paste 800 and the solid conductor 600 to form individual EMI shielded packages 100-1 through 100-8 (sometimes referred to herein generically together as "packages" 100, and individually as "package" 100) (FIGS. 9A and 9B). FIGS. 9A and 9B are simplified views of the individual packages 100. FIG. 9A is a simplified plan view of the packages 100. FIG. 9B is a simplified side view of the packages 100. FIGS. 9A and 9B illustrate cuts 950 through the cured conductive material 800 and the solid conductor 600. In some embodiments, cutting 260 through the cured conductive paste 800 and the solid conductor 600 may include cutting through the cured conductive paste 800 and the solid conductor 600 with a saw. The resulting structure of each of the packages 100 of FIG. 9A may be similar to the package 100 discussed above with reference to FIGS. 1A-1C.

In some embodiments, each of the packages 100 may be enclosed by the cured conductive paste 800 and the solid conductor 600 on all sides except for a bottom side of the packages 100. Accordingly, the method 200 may provide an approach to shielding the packages 100 that is less complex, less intrusive, and less expensive than sputtering metal over the packages 100 (which requires expensive processing in specialized facilities). Also, the method 200 may provide an approach to shielding the packages 100 that may take up less space than solid metal shields that are soldered to the packages 100.

Figure 10:
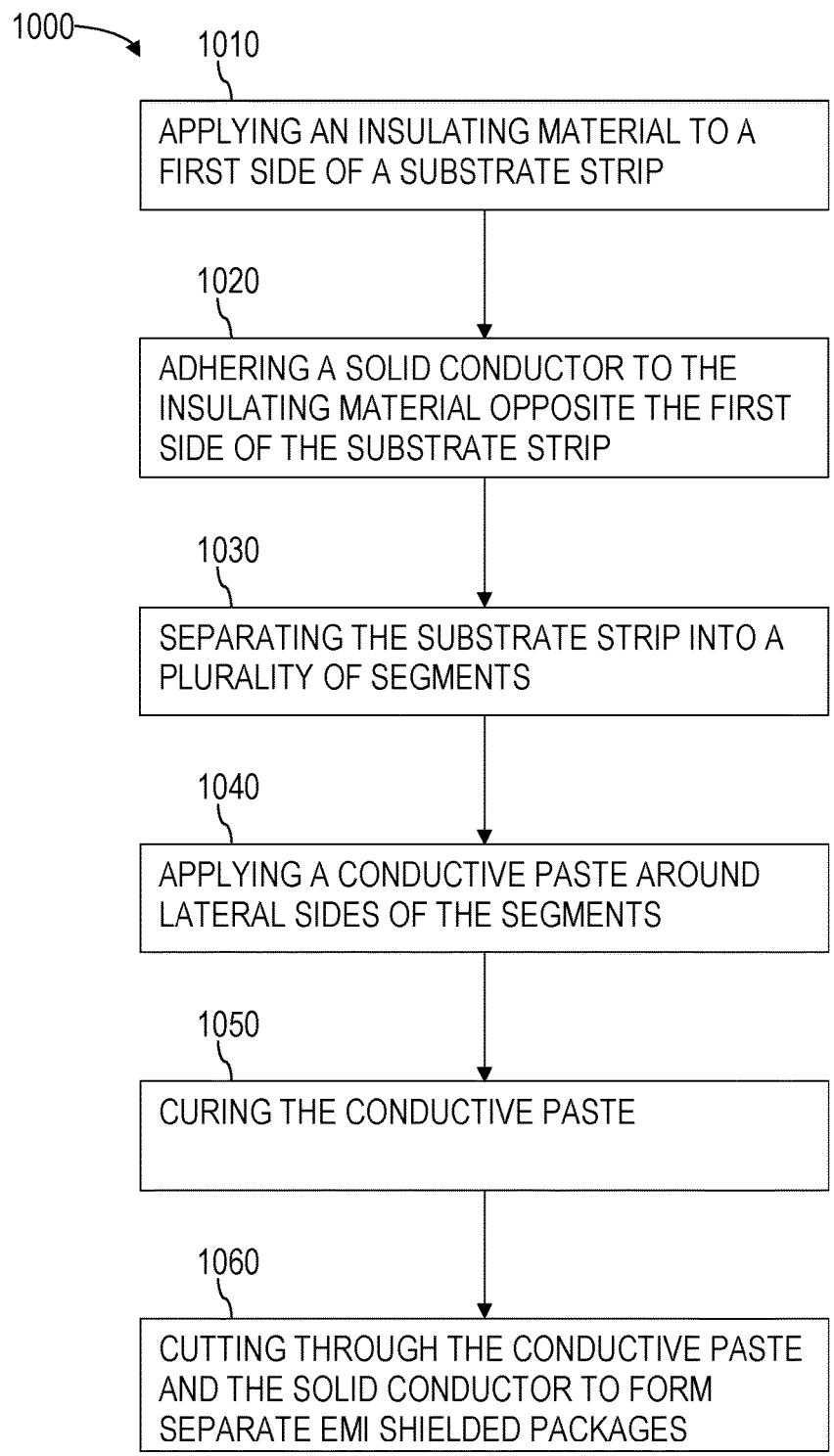
FIG. 10 is another simplified flowchart illustrating another method of forming the electromagnetic radiation shield of the package of FIGS. 1A-1C.

FIG. 10 is another simplified flowchart illustrating another method 1000 of forming the EMI shield 600, 800 of the package 100 of FIGS. 1A-1C. The method 1000 may be similar to the method 200 of FIG. 2. For example, the method 1000 may include applying 1010 an insulating material 400 to a first side 314 of a substrate strip 300, similar to act 210 of FIG. 2. Referring now to FIGS. 10 and 4A-4C, the strip 300 of FIGS. 4A-4C may result from act 1010.

Figure 11A:
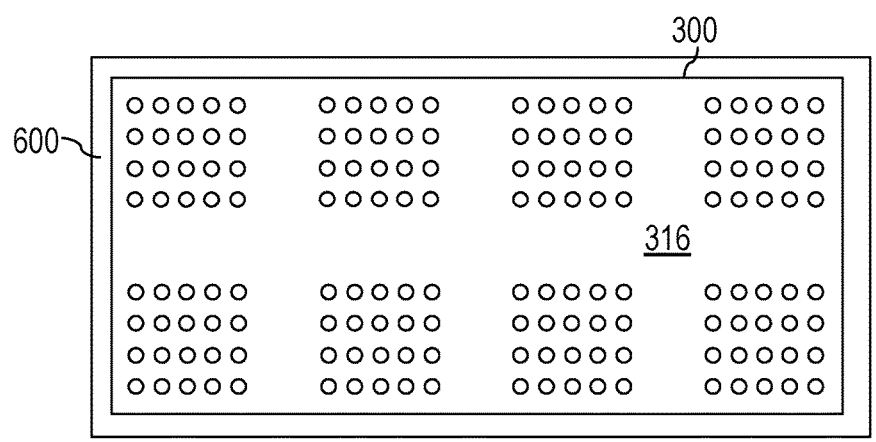
FIGS. 11A and 11B are simplified views of the substrate strip 300 of FIGS. 4A-4C adhered to a solid conductor.
Figure 11B:
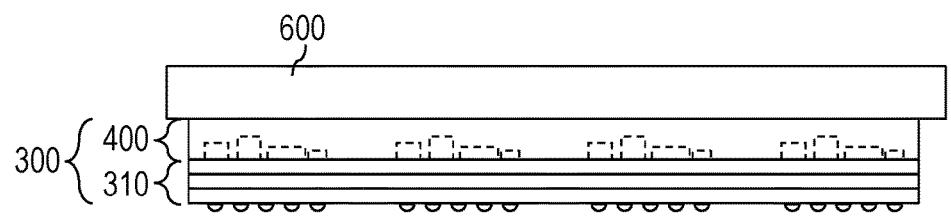

In contrast to the method 200 of FIG. 2, the method 1000 may include adhering a solid conductor 600 to the insulating material 400 opposite the first side 314 of the substrate strip 300 before separating 1030 the substrate strip 300 into a plurality of segments 500. FIGS. 11A and 11B are simplified views of the substrate strip 300 adhered to the solid conductor 600. FIG. 11A is a simplified view of the second side 316 of the substrate strip. FIG. 11B is a simplified side view of the substrate strip 300 adhered to the solid conductor 600. As illustrated in FIG. 11B, the insulating material 400 may be adhered to the solid conductor 600.

Referring to FIGS. 10, 11A, and 11B together, the method 1000 may also include separating 1030 the substrate strip 300 into a plurality of segments 500 (FIGS. 6A and 6B). The segments may be divided similarly as discussed above with reference to the cuts 550 of FIGS. 5A-5C. For example, in some embodiments, separating 1030 the substrate strip 300 into a plurality of segments 500 may include cutting the substrate strip 300 into segments with a saw. The saw may cut at least through the substrate strip 300, and may even partially cut into the solid conductor 600 in some instances. In some embodiments, portions of the substrate strip 300 may be removed to form the segments 500. The resulting structure may be similar to that discussed above with reference to FIGS. 6A and 6B.

The method 1000 may further include applying 1040 a conductive paste 700 around lateral sides of the segments 500, which may be similar to act 240 of FIG. 2. The method 1000 may also include curing the conductive paste 1050, which may be similar to act 250 of FIG. 2. In addition, the method 1000 may include cutting 1060 through the cured conductive paste 800 and the solid conductor 600 to form separate EMI shielded packages 100 (FIGS. 9A and 9B), which may be similar to act 1060 of FIG. 2.

A non-exhaustive list of examples follows. Each of these examples may be combined with any others of the examples, and with embodiments disclosed herein, except as would be understood by one of ordinary skill to not be combinable.

Example 1: A plurality of EMI shielded packages, formed by: applying an insulating material to a first side of a substrate strip including electronic circuitry on or in the first side of the substrate strip; separating the substrate strip into a plurality of segments; adhering the insulating material of the segments to a solid conductor; applying a conductive paste around lateral sides of the segments; curing the conductive paste; and cutting through the conductive paste and the solid conductor to form the plurality of EMI shielded packages.

Example 2: The plurality of EMI shielded packages of Example 1, wherein each of the EMI shielded packages includes a conductive terminal in at least one lateral side, and wherein the cured conductive paste electrically connects the conductive terminal to the solid conductor adhered to the insulating material.

Example 3: The plurality of EMI shielded packages of Example 2, wherein the conductive terminal is electrically connected to ground through the substrate strip.

Example 4: The plurality of EMI shielded packages according to any one of Examples 1-3, wherein the cured conductive paste completely surrounds the lateral sides of the segments.

Example 5: The plurality of EMI shielded packages according to any one of Examples 1-4, wherein the cured conductive paste and the solid conductor completely enclose the segments on all sides except a bottom side.

Example 6: An electronic device package, including: a substrate including electronic circuitry in or on at least a first side of the substrate, and at least one conductive terminal at a lateral edge of the substrate; an insulating material formed over the first side of the substrate and the electronic circuitry; and an electromagnetic interference (EMI) shield including a solid conductor adhered to the insulating material opposite the first side of the substrate, the insulating material electrically insulating the electronic circuitry from the solid conductor; and a cured conductive paste at least partially surrounding the lateral edge of the substrate and electrically connecting the conductive terminal to the solid conductor.

Example 7: The electronic device package of Example 6, wherein the cured conductive paste includes a cured epoxy including conductive particles.

Example 8: The electronic device package of Example 7, wherein the conductive particles include at least one of a solder and a metal.

Example 9: The electronic device package according to any one of Examples 6-8, wherein the at least one conductive terminal extends completely around the lateral edge of the substrate.

Example 10: The electronic device package according to any one of Examples 6-9, wherein the at least one conductive terminal is electrically connected to ground.

Example 11: The electronic device package according to any one of Examples 6-10, wherein the solid conductor includes a metal foil.

Example 12: The electronic device package of Example 11, wherein the metal foil includes at least one metal selected from the group consisting of a copper foil, an aluminum foil, a silver foil, and a gold foil.

Example 13: A method of forming an electromagnetic interference (EMI) shield, the method including: applying an insulating material to a first side of a substrate strip including electrical components formed at least one of on and in the first side of the substrate strip; adhering a solid conductor to the insulating material opposite the first side of the substrate strip, the insulating material electrically insulating the first side of the substrate strip from the solid conductor; separating the substrate strip and the applied insulating material into a plurality of segments; applying a conductive paste at least partially around lateral sides of the plurality of segments, the conductive paste electrically connecting the solid conductor to a conductive terminal exposed on at least one lateral side of each of the plurality of segments; and cutting through the conductive paste and the solid conductor to form a plurality of EMI shielded packages.

Example 14: The method of Example 13, wherein applying an insulating material to a first side of a substrate strip includes applying an electrically insulating epoxy to the first side of the substrate strip.

Example 15: The method of Example 13, wherein applying an insulating material to a first side of a substrate strip includes applying an oxide material to the first side of the substrate strip.

Example 16: The method according to any one of Examples 13-15, wherein adhering a solid conductor to the insulating material and separating the substrate strip and the applied insulating material into a plurality of segments includes separating the substrate strip and the applied insulating material into the plurality of segments before adhering the solid conductor to the insulating material opposite the first side of the substrate strip.

Example 17: The method according to any one of Examples 13-16, wherein adhering the solid conductor to the insulating material opposite the first side of the substrate strip includes applying each of the plurality of segments to a conductive foil.

Example 18: The method according to any one of Examples 13-15, wherein adhering a solid conductor to the insulating material and separating the substrate strip into the plurality of segments includes adhering the solid conductor to the insulating material before separating the substrate strip and the insulating material into the plurality of segments.

Example 19: The method according to any one of Examples 13-18, wherein applying a conductive paste at least partially around the plurality of electronic packages includes applying a conductive epoxy at least partially around each of the plurality of electronic packages.

Example 20: The method according to any one of Examples 13-19, wherein applying a conductive paste includes applying the conductive paste with a resilient blade tool.

Example 21: The method according to any one of Examples 13-19, wherein applying a conductive paste includes applying the conductive paste with an injection tool.

Example 22: The method according to any one of Examples 13-19, wherein applying a conductive paste includes flowing a heated conductive paste at least partially around the lateral sides of the segments.

Example 23: The method according to any one of Examples 13-22, wherein applying a conductive paste includes completely laterally surrounding each of the segments with the conductive paste.

Example 24: The method according to any one of Example 13-22, further including curing the conductive paste to a conductive solid.

Example 25: The method of Example 24, wherein curing the conductive paste includes heating the conductive paste.

Example 26: A method of forming EMI shields for a plurality of electronic device packages, the method including: applying an insulating material to a first side of a substrate strip including electronic circuitry on or in the first side of the substrate strip; separating the substrate strip into a plurality of segments; adhering the insulating material of the segments to a solid conductor; applying a conductive paste around lateral sides of the segments; curing the conductive paste; and cutting through the conductive paste and the solid conductor to form the plurality of EMI shielded packages.

Example 27: The method of Example 26, further including electrically connecting a conductive terminal in a lateral side of each of the segments to the solid conductor adhered to the insulating material.

Example 28: The method of Example 27, further including electrically connecting the conductive terminal to ground through the substrate strip.

Example 29: The method according to any one of Examples 26-28, wherein the cured conductive paste completely surrounds the lateral sides of the segments.

Example 30: The method according to any one of Examples 26-29, further including completely enclosing the segments on all sides except a bottom side with the cured conductive paste and the solid conductor.

Example 31: An electronic device package, including: a substrate including electronic circuitry in or on at least a first side of the substrate, and at least one conductive terminal at a lateral edge of the substrate; an insulating material formed over the first side of the substrate and the electronic circuitry; and an electromagnetic interference (EMI) shield including: a solid conductor adhered to the insulating material opposite the first side of the substrate, the insulating material electrically insulating the electronic circuitry from the solid conductor, and a means for shielding at least a portion of the lateral edge of the substrate and electrically connecting the conductive terminal to the solid conductor without sputtering a conductive material onto the substrate.

Example 32: The electronic device package of Example 31, wherein the means for shielding the at least a portion of the lateral edge of the substrate includes a cured conductive paste including a cured epoxy including conductive particles.

Example 33: The electronic device package of Example 32, wherein the conductive particles include at least one of a solder and a metal.

Example 34: The electronic device package according to any one of Examples 31-33, wherein the at least one conductive terminal extends completely around the lateral edge of the substrate.

Example 35: The electronic device package according to any one of Examples 31-34, wherein the at least one conductive terminal is electrically connected to ground.

Example 36: The electronic device package according to any one of Examples 31-35, wherein the solid conductor includes a metal foil.

Example 37: The electronic device package of Example 36, wherein the metal foil includes at least one metal selected from the group consisting of a copper foil, an aluminum foil, a silver foil, and a gold foil.

Example 38: A plurality of electromagnetic interference (EMI) shielded electronic device packages formed by: applying an insulating material to a first side of a substrate strip including electrical components formed at least one of on and in the first side of the substrate strip; adhering a solid conductor to the insulating material opposite the first side of the substrate strip, the insulating material electrically insulating the first side of the substrate strip from the solid conductor; separating the substrate strip and the applied insulating material into a plurality of segments; applying a conductive paste at least partially around lateral sides of the plurality of segments, the conductive paste electrically connecting the solid conductor to a conductive terminal exposed on at least one lateral side of each of the plurality of segments; and cutting through the conductive paste and the solid conductor to form a plurality of EMI shielded packages.

Example 39: The plurality of EMI shielded electronic device packages of Example 38, wherein the insulating material includes an electrically insulating epoxy.

Example 40: The plurality of EMI shielded electronic device packages of Example 38, wherein the insulating material includes an oxide material.

Example 41: The plurality of EMI shielded electronic device packages according to any one of Examples 38-40, wherein the substrate strip and the applied insulating material are separated into the plurality of segments before the solid conductor is adhered to the insulating material.

Example 42: The plurality of EMI shielded electronic device packages according to any one of Examples 38-41, wherein the solid conductor includes a conductive foil.

Example 43: The plurality of EMI shielded electronic device packages according to any one of Examples 38-40 and 42, wherein the solid conductor is adhered to the insulating material before separating the substrate strip and the insulating material into the plurality of segments.

Example 44: The plurality of EMI shielded electronic device packages according to any one of Examples 38-43, wherein the conductive paste includes a conductive epoxy.

Example 45: The plurality of EMI shielded electronic device packages according to any one of Examples 38-44, wherein the conductive paste is applied with a resilient blade tool.

Example 46: The plurality of EMI shielded electronic device packages according to any one of Examples 38-44, wherein the conductive paste is applied with an injection tool.

Example 47: The plurality of EMI shielded electronic device packages according to any one of Examples 38-44, the conductive paste includes a conductive paste that was heated and flowed around the lateral sides of the segments.

Example 48: The plurality of EMI shielded electronic device packages according to any one of Examples 38-47, wherein the conductive paste completely laterally surrounds each of the segments.

Example 49: The plurality of EMI shielded electronic device packages according to any one of Example 38-48, wherein the conductive paste is cured to form a conductive solid.

Example 50: The plurality of EMI shielded electronic device packages of Example 49, wherein the conductive paste is cured by heating the conductive paste.

Example 51: A non-transitory computer-readable storage medium including computer-readable instructions stored thereon, the computer readable instructions configured to instruct a processor to perform any one of the methods of Examples 13-30.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of embodiments encompassed by the disclosure, as contemplated by the inventors.

The invention claimed is:

1. A method of forming an electromagnetic interference (EMI) shield, the method comprising:
   applying an insulating material to a first side of a substrate strip including electrical components formed at least one of on or in the first side of the substrate strip;
   adhering a solid conductor to the insulating material opposite the first side of the substrate strip, the insulating material electrically insulating the first side of the substrate strip from the solid conductor;
   separating the substrate strip and the applied insulating material into a plurality of segments;
   applying a conductive paste at least partially around lateral sides of the plurality of segments, the conductive paste electrically connecting the solid conductor to a conductive terminal exposed on at least one lateral side of each of the plurality of segments; and
   cutting through the conductive paste and the solid conductor to form a plurality of EMI shielded packages.

2. The method of claim 1, wherein applying an insulating material to a first side of a substrate strip comprises applying an electrically insulating epoxy to the first side of the substrate strip.

3. The method of claim 1, wherein applying an insulating material to a first side of a substrate strip comprises applying an oxide material to the first side of the substrate strip.

4. The method of claim 1, wherein adhering a solid conductor to the insulating material and separating the substrate strip and the applied insulating material into a plurality of segments comprises separating the substrate strip and the applied insulating material into the plurality of segments before adhering the solid conductor to the insulating material opposite the first side of the substrate strip.

5. The method of claim 4, wherein adhering the solid conductor to the insulating material opposite the first side of the substrate strip comprises applying each of the plurality of segments to a conductive foil.

6. The method of claim 1, wherein adhering a solid conductor to the insulating material and separating the substrate strip into the plurality of segments comprises adhering the solid conductor to the insulating material before separating the substrate strip and the insulating material into the plurality of segments.

7. The method of claim 1, wherein applying a conductive paste at least partially around the plurality of electronic packages comprises applying a conductive epoxy at least partially around each of the plurality of electronic packages.

8. The method of claim 1, wherein applying a conductive paste comprises applying the conductive paste with a resilient blade tool.

9. The method of claim 1, wherein applying a conductive paste comprises applying the conductive paste with an injection tool.

10. The method of claim 1, wherein applying a conductive paste comprises flowing a heated conductive paste at least partially around the lateral sides of the segments.

11. The method of claim 1, wherein applying a conductive paste comprises completely laterally surrounding each of the segments with the conductive paste.

12. The method of claim 1, further comprising curing the conductive paste to a conductive solid.

13. The method of claim 12, wherein curing the conductive paste comprises heating the conductive paste.

14. A plurality of EMI shielded packages, formed by:
applying an insulating material to a first side of a substrate strip including electrical components formed at least one of on and in the first side of the substrate strip;
adhering a solid conductor to the insulating material opposite the first side of the substrate strip, the insulating material electrically insulating the first side of the substrate strip from the solid conductor;
separating the substrate strip and the applied insulating material into a plurality of segments;
applying a conductive paste at least partially around lateral sides of the plurality of segments, the conductive paste electrically connecting the solid conductor to a conductive terminal exposed on at least one lateral side of each of the plurality of segments; and
cutting through the conductive paste and the solid conductor to form a plurality of EMI shielded packages.

15. The plurality of EMI shielded packages of claim 14, wherein the conductive terminal is electrically connected to ground through the substrate strip.

16. The plurality of EMI shielded packages of claim 14, wherein the conductive paste completely surrounds the lateral sides of each of the plurality of segments.

17. The plurality of EMI shielded packages of claim 14, wherein the conductive paste and the solid conductor completely enclose each of the plurality of segments on all sides except a bottom side.

18. The plurality of EMI shielded packages of claim 14, wherein the solid conductor comprises a metal foil.

19. The plurality of EMI shielded packages of claim 14, wherein the conductive paste comprises a cured epoxy including conductive particles.

20. The plurality of EMI shielded packages of claim 19, wherein the conductive particles include at least one of a solder or a metal.

* * * * *